United States Patent
Mittal et al.

(10) Patent No.: US 10,566,959 B1
(45) Date of Patent: Feb. 18, 2020

(54) SENSE AMPLIFIER FLIP-FLOP AND METHOD FOR FIXING SETUP TIME VIOLATIONS IN AN INTEGRATED CIRCUIT

(71) Applicant: SAMSUNG ELECTRONICS CO., LTD., Suwon-si (KR)

(72) Inventors: Sajal Mittal, Bengaluru (IN); Parvinder Kumar Rana, Bengaluru (IN); Abhishek Ghosh, Bengaluru (IN); Rajeela Deshpande, Bengaluru (IN)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/276,212

(22) Filed: Feb. 14, 2019

(30) Foreign Application Priority Data

Oct. 24, 2018 (IN) .............................. 201841040233

(51) Int. Cl.
| | |
|---|---|
| *H03K 3/3562* | (2006.01) |
| *H03K 3/356* | (2006.01) |
| *H03K 3/037* | (2006.01) |
| *G06F 1/10* | (2006.01) |
| *G06F 1/12* | (2006.01) |

(52) U.S. Cl.
CPC .......... *H03K 3/35625* (2013.01); *G06F 1/10* (2013.01); *G06F 1/12* (2013.01); *H03K 3/0375* (2013.01); *H03K 3/356139* (2013.01)

(58) Field of Classification Search
None
See application file for complete search history.

(56) References Cited

U.S. PATENT DOCUMENTS

| | | | |
|---|---|---|---|
| 7,772,889 B2 | 8/2010 | Naffziger | |
| 8,164,363 B1 | 4/2012 | Su | |
| 2017/0248989 A1 | 8/2017 | Vrudhula et al. | |
| 2018/0359442 A1* | 12/2018 | Park | ........................ H04N 5/378 |
| 2019/0115903 A1* | 4/2019 | Xu | .......................... H03K 3/037 |

FOREIGN PATENT DOCUMENTS

CN        104333351 B      2/2017

OTHER PUBLICATIONS

Nikolic & Oklobdzija, "Design and Optimization of Sense-Amplifier-Based Flip-Flops", Solid-State Circuits Conference, ESSCIRC'99, 1999, pp. 410-413 (4 pages total).

* cited by examiner

*Primary Examiner* — Jany Richardson
(74) *Attorney, Agent, or Firm* — Sughrue Mion, PLLC

(57) ABSTRACT

A method and a sense amplifier flip-flop (SAFF) for fixing setup time violations in an integrated circuit (IC) design. The SAFF includes a master latch coupled to a slave latch, wherein the master latch includes a sense amplifier and the SAFF is configured with an equal number of p-type metal oxide semiconductor (PMOS) transistors and n-type metal oxide semiconductor (NMOS) transistors to reduce block area of an integrated circuit (IC). The method includes receiving a clock signal, receiving a data signal, applying the data signal to the sense amplifier when the clock signal is at a low level, wherein a portion of the sense amplifier is responsive to the inverted clock signal, storing a value of the data signal in the slave latch when the clock signal transitions from the low level to the high level, and providing an output signal from the slave latch.

16 Claims, 6 Drawing Sheets

SENSE AMPLIFIER FLIP-FLOP AND METHOD FOR FIXING SETUP TIME VIOLATIONS IN AN INTEGRATED CIRCUIT

CROSS REFERENCE TO RELATED APPLICATIONS

This application is based on and claims priority under 35 U.S.C. § 119 to Indian Patent Application No. 201841040233, filed on Oct. 24, 2018 in the Indian Patent Office, the disclosure of which is incorporated by reference herein in its entirety.

BACKGROUND

1. Field

The present disclosure relates to semiconductor integrated circuits (IC) and more particularly related to a sense amplifiers based flip-flop for fixing setup time violations without increasing the block area of the IC.

2. Description of Related Art

The terms "flop" and "flip-flop" are generally used to describe or to refer to a clocked electronic circuit having two stable states. The clocked electronic circuit is used to store a value. A flop generally comprises two latch circuits. Flip-flops have many and varied applications, and are widely used in digital circuits. One important use of flip-flops is to store bits of an instruction within an instruction pipeline of a central processing unit (CPU) or a graphical processing unit (GPU). In a related art flip-flop electronic circuit, data is stored in cross-coupled inverters. A first, or "master" latch comprises a pass or transmission gate and a cross-coupled inverter. A second, or "slave" latch similarly comprises a pass gate and a cross-coupled inverter. A clock signal controls the operation of the two pass gates, and hence the operation of the flip-flop circuit.

High-speed chip designs may suffer from setup time violations which are critical to fix. Hence, a synthesis tool addresses setup time violations by increasing data path drive (driving current) or adding extra buffers in a clock path so that a time difference between a clock edge and a data edge will increase; the arrival of the data edge before the clock edge with sufficient time will resolve the setup time violation. Increasing data path drive and adding extra buffers as approached to resolving setup time violations significantly increase block area.

Figure 1:
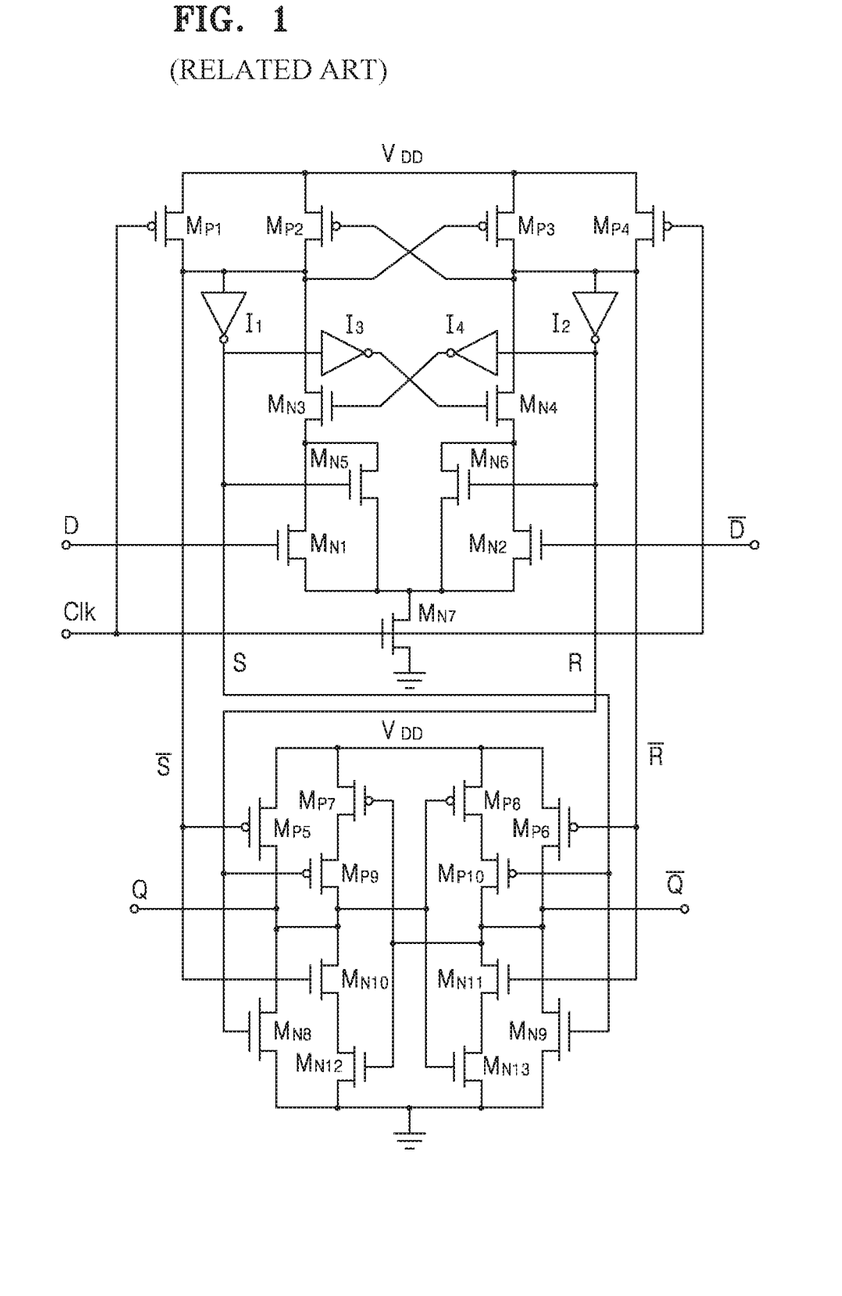
FIG. 1 is a sense amplifier flip-flop circuit diagram, according to the related art.

FIG. 1 illustrates a related art flip-flop, wherein a master part of the flip-flop uses a related art sense-amplifier. The sense-amplifier part of the flip-flop includes dominating number of n-type metal oxide semiconductor (NMOS), which increases the required layout area significantly. Further, extra feedback buffers are added to avoid setup time violations, which also increase the layout area. High layout area makes the flip-flop unsuitable for a standard cell library. Further, the use of data inverters increases skew between data arc and data_bar arc (the time waveform of the outputs Q and its inverse of FIG. 1). The slave part of the related art flip-flop is not scalable hence very high layout area for higher drive cells.

In FIG. 1, the flip-flop includes a master latch and a slave latch. The master latch of the flip-flop uses a sense-amplifier architecture. When the master latch of the flip-flop receives a low state clock (CK) signal, transistors Mp1 and Mp4 conduct and corresponding nodes present in the master latches are pre-charged. The pre-charged nodes are the input of inverter $I_1$ and the input of inverter $I_2$; also called controlling nodes. The pre-charged nodes turn ON $M_{N3}$ and $M_{N4}$ transistors. Hence, pre-charged nodes are electrically connected to the data transistors $M_{N1}$ and $M_{N2}$. Further, when, the CK signal state goes high, one of the pre-charged nodes will discharge and the other node will be maintained at a logic high value with the help of $M_{P2}$ and $M_{P3}$ depending upon the data D and D_bar. Transistors $M_{N5}$ and $M_{N6}$ make the design static in nature. Static means that, if the data changes (D) when the CK is high, there is no effect on the voltage of the output node (Q).

The controlling nodes are pre-charged when the clock is low; at this time the circuit does not couple the input data (D) to the output (Q). When the clock transitions to a high state, one of the controlling nodes remains pre-charged (at logic 1) and the other controlling node can be dis-charged (at logic 0); which controlling node changes state depends on the input data in the master latch. The input data then transitions from the master latch to the slave latch. Continuing to refer to FIG. 1, depending upon the controlling nodes, the output signal (Q) is pulled-up or pulled-down and then maintained using a feedback circuitry ($M_{P7}$, $M_{P9}$, $M_{N10}$ and $M_{N12}$) The output remains unchanged during a CK signal with low logic level.

Figure 2A:
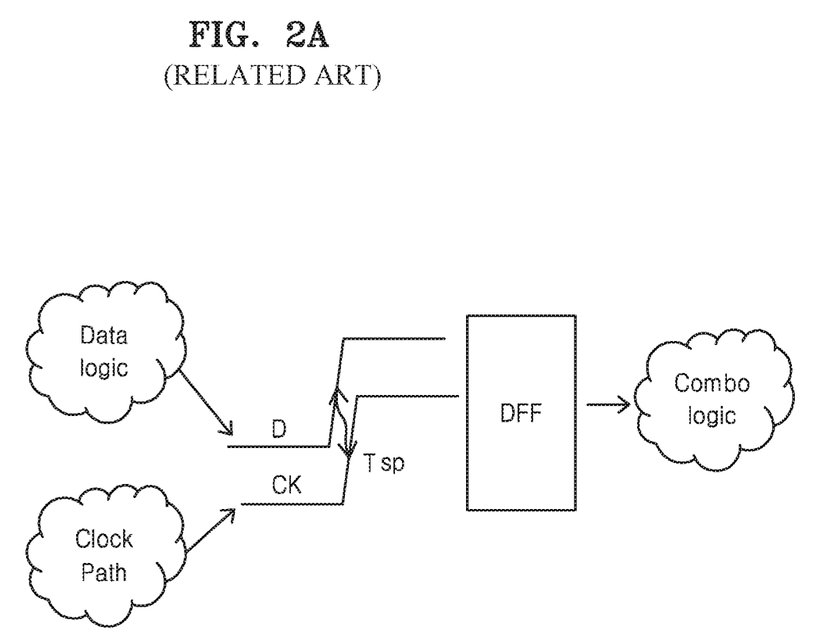
FIGS. 2A and 2B are examples illustrating setup time violations in an integrated circuit (IC) design, according to the related art.
Figure 2B:
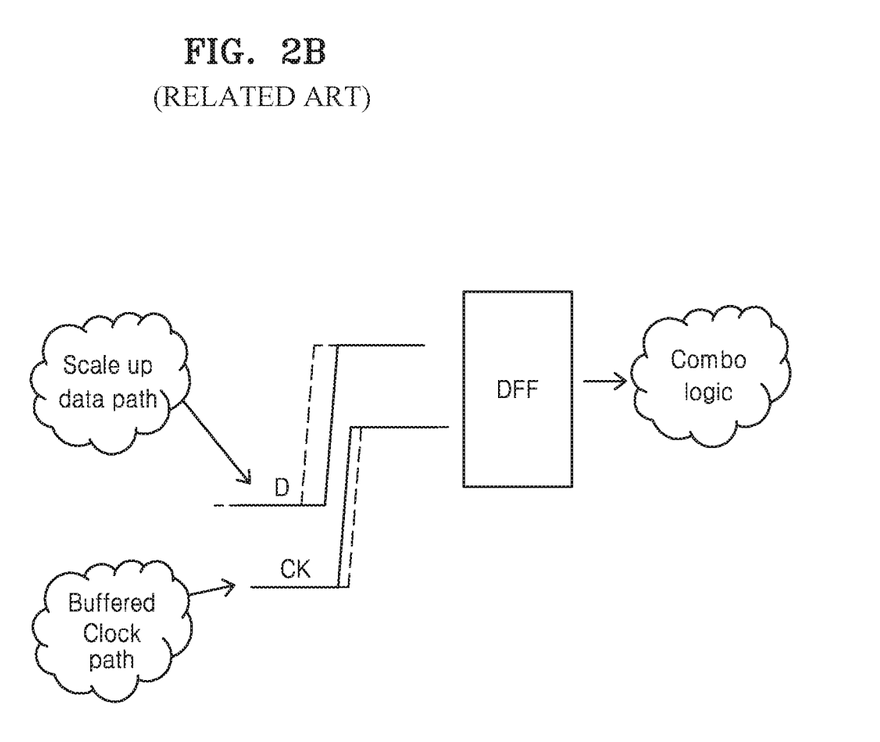

FIGS. 2a and 2b are examples illustrating setup time violations in an integrated circuit (IC) design. FIGS. 2a and 2b each include a flip-flop block (i.e., DFF), a data path, a clock path and a combo logic. "Combo logic" refers to combinatorial logic such as AND, OR, and inverter circuits without internal memory storage. The data path is the path through which a data signal travels. The clock path is a path through which a clock signal travels. The combo logic is the circuit which is downstream of one or more flip-flops and outputs of the one or more flip-flops are provided as inputs to the combo logic. IC design frequently relies on a synthesis tool. The synthesis tool may use a related art strategy of high-drive cells in the data path to shift data edges to left hand side (earlier with respect to a clock edge) or include buffer delay in the clock path to shift the clock edge to the right hand side (later with respect to the data edge). However, the related art strategy increases the block area of a chip when resolving setup time violations.

In view of the foregoing, there is a need to provide a flip flop design, which has nearly zero setup time to fix setup time violations without increasing the block area of the IC.

SUMMARY

Example embodiments provide a method and a sense amplifier flip-flop (SAFF) for overcoming or reducing setup time violations in an integrated circuit (IC) design.

According to an aspect of an example embodiment, there is provided a sense amplifier flip-flop (SAFF) including a slave latch, a master latch coupled to the slave latch and configured to receive a clock signal, wherein the master latch comprises an equal number of p-type metal oxide semiconductor (PMOS) transistors and n-type metal oxide semiconductor (NMOS) transistors that are configured to reduce block area of an integrated circuit (IC). The SAFF also includes a clock inverter coupled to the master latch and configured to receive the clock signal and to generate an inverted clock signal that is input to the master latch, wherein the clock inverter is further configured to transition the inverted clock signal from a low logic level to a high logic level when the clock signal transitions from a high logic level to a low logic level.

According to another aspect of an example embodiment, there is provided a method for fixing setup time violations in an integrated circuit (IC) design using a sense amplifier flip-flop (SAFF), wherein the SAFF includes a master latch coupled to a slave latch, wherein the master latch includes a sense amplifier and the SAFF is configured with an equal number of p-type metal oxide semiconductor (PMOS) transistors and n-type metal oxide semiconductor (NMOS) transistors to reduce block area of an integrated circuit (IC), the method including: receiving a clock signal, generating an inverted clock signal from the clock signal, wherein the inverted clock signal transitions from a low logic level to a high logic level when a clock signal transitions from a high logic level to a low logic level, receiving a data signal, applying the data signal to the sense amplifier when the clock signal is at a low level, wherein a portion of the sense amplifier is responsive to the inverted clock signal, storing a value of the data signal in the slave latch when the clock signal transitions from the low level to the high level, and providing an output signal from the slave latch.

According to another aspect of an example embodiment, there is proved a clocked data circuit includes a first data stage; a second data stage; a first latch buffer including a first buffer input, wherein an output of the first latch buffer is coupled to a first controlling node; a second latch buffer including a second buffer input, wherein an output of the second latch buffer is coupled to a second controlling node; a first clock stage coupled to an input of the first latch buffer; a second clock stage coupled to an input of the second latch buffer; a sense amplifier; and a slave latch, wherein the first data stage is coupled to a first input of the sense amplifier, the first input of the sense amplifier being the first controlling node, wherein the second data stage is coupled to a second input of the sense amplifier, the second input of the sense amplifier being the second controlling node, and wherein each of the first controlling node and the second controlling node is configured to be pre-charged by the first clock stage and the second clock stage, respectively, when a clock signal is a low level.

BRIEF DESCRIPTION OF THE DRAWINGS

The above and/or other aspects will be more apparent from the following description of example embodiments taken in conjunction with the accompanying drawings, in which.

DETAILED DESCRIPTION

The example embodiments herein and the various features and advantageous details thereof are explained more fully with reference to the non-limiting embodiments that are illustrated in the accompanying drawings and detailed in the following description. Descriptions of well-known components and processing techniques are omitted so as to not unnecessarily obscure the embodiments herein. The description herein is intended merely to facilitate an understanding of ways in which the example embodiments herein can be practiced and to further enable those of skill in the art to practice the example embodiments herein. Accordingly, this disclosure should not be construed as limiting the scope of the example embodiments herein.

Figure 3:
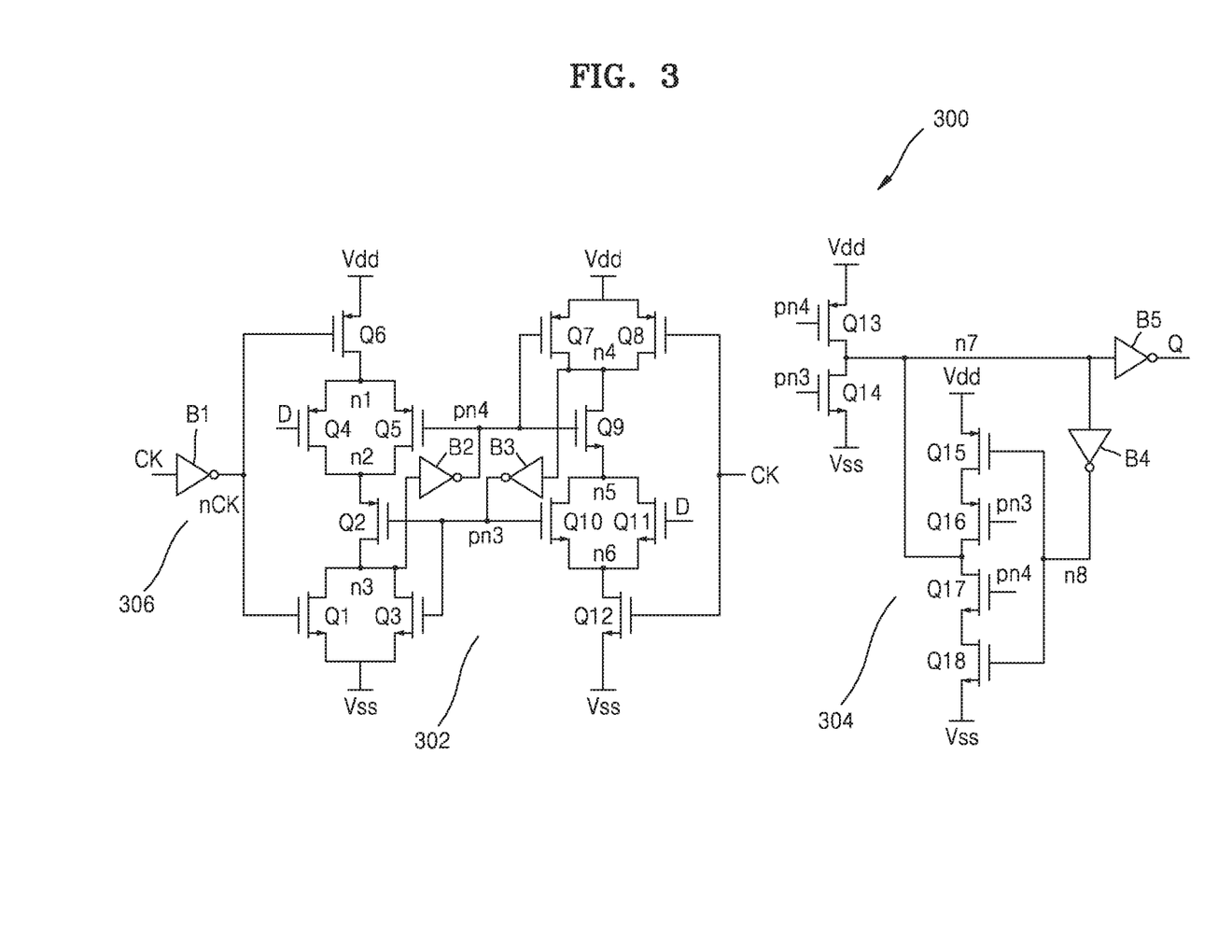
FIG. 3 is a sense amplifier flip-flop (SAFF) circuit diagram for avoiding setup time violations in the integrated circuit (IC) design, according to an example embodiment.
Figure 4:
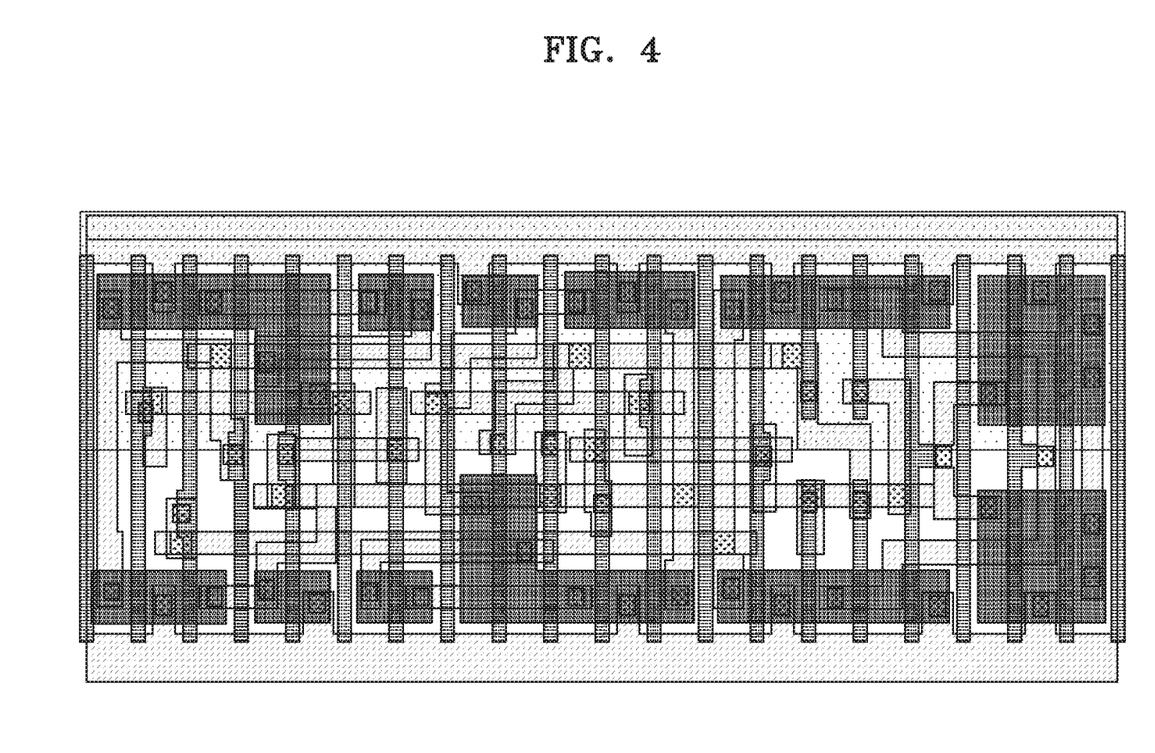
FIG. 4 is a layout diagram of an SAFF circuit, according to an example embodiment.
Figure 5:
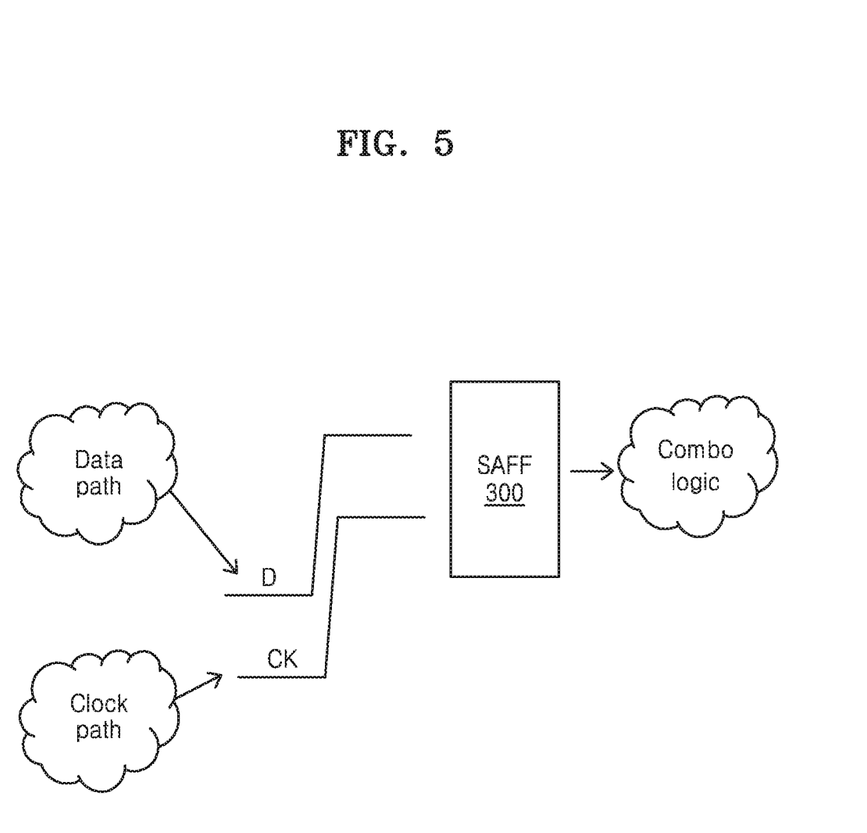
FIG. 5 is a diagram illustrating an SAFF for fixing setup time violations without increasing the block area of the integrated circuit (IC), according to an example embodiment.

The example embodiments herein achieve method and a sense amplifier flip-flop (SAFF) for overcoming setup time violations in an integrated circuit (IC) design. The SAFF includes a master latch coupled to a slave latch. The master latch is configured with an equal number of p-type metal oxide semiconductor (PMOS) transistors and n-type metal oxide semiconductor (NMOS) transistors to reduce block area of the IC. Further, the SAFF includes a clock inverter. The clock inverter can be configured to generate an inverted clock signal transition from low logic level to high logic level when a clock signal transitions from a high logic level to a low logic level. Further, the clock inverter can be configured to generate the inverted clock signal transition from the high logic level to the low logic level when the clock signal transitions from the low logic level to the high logic level. In an example embodiment, transition of the clock signal from the high logic level to the low logic level and the transition of the inverted clock signal from the low logic level to the high logic level enables at least two controlling nodes to a pre-charged state and discharged state respectively and maintains an output signal using the slave latch. In an example embodiment, transition of the clock signal from the low logic level to the high logic level and the transition of the inverted clock signal from the high logic level to the low logic level, flips one of at least two controlling nodes based on a input data and maintains the at least two controlling nodes at same logic level to generate a final output signal from the slave latch. The equal number of PMOS transistors and NMOS transistors present in the master latch of the SAFF avoids setup time violations without increasing block area of the IC. Referring now to the drawings, and more particularly to FIGS. 3, 4, and 5, where similar reference characters denote corresponding features consistently throughout the figures, there are shown example embodiments.

FIG. 3 is an SAFF 300 circuit diagram for avoiding setup time violations in the IC design, according to an example embodiment.

The example embodiments herein provides the SAFF 300 for avoiding setup time violations in the IC design without increasing the block area of the IC. The SAFF 300 comprises a master latch coupled to a slave latch. The master latch 302 of the SAFF 300 configured with an equal number of p-type metal oxide semiconductor (PMOS) transistors and n-type metal oxide semiconductor (NMOS) transistors to reduce block area of the IC. Further, the SAFF 300 comprises a clock inverter 306 to generate an inverted clock signal transitions from a low logic level to a high logic level when a clock signal transitions from a high logic level to a low logic level. Further, the clock inverter 306 can be configured to generate the inverted clock signal transition from the high logic level to the low logic level when the clock signal transitions from the low logic level to the high logic level.

In an example embodiment, transition of the clock signal from the high logic level to the low logic level and the transition of the inverted clock signal from the low logic level to the high logic level enables at least two controlling nodes (pn3, pn4) to a pre-charged state and discharged state respectively and maintains an output signal using the slave latch 304. The node pn3 may also be called a precharge node. The node pn4 may also be called a precharge node. The node pn3 is the output of B3 and the node pn4 is the output of B2. B2 is referred to as a latch buffer and B3 is a corresponding latch buffer. The sense amplifier of FIG. 3 includes N channel transistor Q9 and P channel transistor Q2. Control node pn3 is coupled to a gate of Q2 and control node pn4 is coupled to a gate of Q9.

In an example embodiment, transition of the clock signal from the low logic level to the high logic level and the transition of the inverted clock signal from the high logic level to the low logic level, flips one of the at least two controlling nodes (pn3, pn4) based on a input data and maintains the at least two controlling nodes (pn3, pn4) at same logic level to generate a final output signal form the slave latch 304. In an example embodiment, equal number of PMOS transistors and NMOS transistors present in the master latch 302 of the SAFF 300 avoids setup time violations without increasing a block area of the IC. The SAFF 300 does not require a data inverter, hence no skew between data arcs. The slave latch 304 can be scalable and suitable for standard cell library.

For example, when the master latch 302 receives a clock (CK) signal of low logic level, the negative/inverted clock (nCK) signal switches to high logic level, nodes n3 and n4 present in the master latch 302 can be discharged and pre-charged respectively. Due to the discharge and the pre-charge of the nodes n3 and n4, controlling nodes pn4 and pn3 can pull-up and pull-down respectively. Due to which some transistors may turn-off and some transistors may turn-on. For example, the transistors Q3, Q7, Q5 and Q10 will turn off and the transistors Q2 and Q9 will turn ON. Hence, an input data can directly connected to the nodes n3 and n4 and waiting for a positive edge of the clock signal. The transistors Q4 and Q11 are referred to as data stages. Q1 and Q8 are clock stages.

Further, based on the input data, the node n3 can charge or the node n4 can discharge keeping other node at previous value. For example, when the CK signal goes to logical level 1 which drives nCK signal to logical level 0, which turns ON Q6 and Q12 transistors. Suppose when an input data D=0, Turns ON transistor Q4 which charges the node n3 and discharges the node pn4. Further, the CK signal at logical level 1 turns OFF the transistor Q9 and turns ON the transistor Q5 which make the master latch 302 static and prevents change in the output regardless of a change in the input data. Further, the CK signal at logical level 1 turns ON the transistor Q7 which drives the node n4 to logic 1 and pn3 to logic 0.

In summary, an example of operation of the master latch is as follows. The sense amplifier inputs (gates of Q2 and Q9) are pre-charged based on the operation of the clock stages (Q1 and Q8). ii) The clock stages switch from low to high, and one of the nodes n3 and n4 changes state. For example, if the input data D of data stage Q4 is low, the sense amplifier input node pn4 will be discharged because data stage transistor Q4 will turn ON, sense amplifier transistor Q2 will turn ON, n3 will be high, and latch buffer B2 will drive its output low. The resulting data value is coupled through to the slave latch during the time the clock is high.

At slave latch 304, when the input data D=0 ("LOW" or "OFF"), and the controlling nodes pn4=0, pn3=0. Then the controlling nodes pn3 and pn4 can be connected to the slave latch 304 and pull-up node n7 and drive the output node Q to a low logical level. Further, the output value can be maintained based a feedback loop and a stack, which are made up of Q15, Q16, Q17 and Q18 transistors. Similarly, when the CK signal is at a logical level 1 and the input data D has value 1, then pn4=1 and pn3=1. The controlling nodes pn4=1, pn3=1, will pull-down node n7 and the output node Q will be driven to a high logic level. Q is maintained using the feedback loop when CK is at low logic level.

FIG. 4 is a layout diagram of the SAFF 300 circuit according to an example embodiment. The SAFF 300 can be replaced in place of a related art flip-flop in the IC design to overcome the setup time violations without increasing the block level area of the IC.

FIG. 5 is diagram illustrating an SAFF 300 for fixing setup time violations without increasing the block area of the IC, according to an example embodiment. The SAFF 300 can be replaced in place of a related art flip flop that results in avoiding setup time violations without increasing the block level area of the IC. The master latch 302 of the SAFF 300 includes an equal number of NMOS and PMOS.

The example embodiments can be implemented through at least one software program running on at least one hardware device and performing functions to control the elements. The elements shown in FIG. 3 can be at least one of a hardware device, or a combination of hardware device and software module.

The foregoing example embodiments may be modified and/or adapted without departing from the inventive concept, and, therefore, such adaptations and modifications should and are intended to be comprehended within the meaning and range of equivalents of the example embodiments. It is to be understood that the phraseology or terminology employed herein is for the purpose of description and not of limitation. Therefore, those skilled in the art will recognize that the example embodiments herein can be practiced with modification within the spirit and scope of the present disclosure.

What is claimed is:

1. A sense amplifier flip-flop (SAFF) comprising:
   a slave latch;
   a master latch coupled to the slave latch via a first controlling node and a second controlling node, and configured to receive a clock signal, wherein the master latch comprises an equal number of p-type metal oxide semiconductor (PMOS) transistors and n-type metal oxide semiconductor (NMOS) transistors that are configured to reduce a block area of an integrated circuit (IC); and
   a clock inverter coupled to the master latch and configured to receive the clock signal and to generate an inverted clock signal that is input to the master latch, wherein the clock inverter is further configured to transition the inverted clock signal from a low logic level to a high logic level when the clock signal transitions from a high logic level to a low logic level, wherein the SAFF comprises an equal number of p-type metal oxide semiconductor (PMOS) transistors and n-type metal oxide semiconductor (NMOS) transistors.

2. The SAFF of claim 1, wherein the clock inverter is further configured to transition the inverted clock signal from the high logic level to the low logic level when the clock signal transitions from the low logic level to the high logic level.

3. The SAFF of claim 1, wherein the transition of the clock signal from the high logic level to the low logic level and the transition of the inverted clock signal from the low logic level to the high logic level establishes at least two controlling nodes at a pre-charged state and at a discharged state respectively and maintains an output signal using the slave latch, wherein the at least two controlling nodes include the first controlling node and the second controlling node.

4. The SAFF of claim 3, wherein the transition of the clock signal from the low logic level to the high logic level and the transition of the inverted clock signal from the high logic level to the low logic level, flips one of the at least two controlling nodes based on a input data and maintains the at least two controlling nodes at unchanged logic levels to generate a final output signal form the slave latch.

5. A method for fixing setup time violations in an integrated circuit (IC) design using a sense amplifier flip-flop (SAFF), wherein the SAFF includes a master latch coupled to a slave latch, wherein the master latch includes a sense amplifier and the SAFF is configured with an equal number of p-type metal oxide semiconductor (PMOS) transistors and n-type metal oxide semiconductor (NMOS) transistors configured to reduce a block area of the IC, the method comprising:
receiving a clock signal;
generating an inverted clock signal from the clock signal which transitions from a low logic level to a high logic level when a clock signal transitions from a high logic level to a low logic level;
receiving a data signal;
applying the data signal to the sense amplifier when the clock signal is at the low logic level, wherein a portion of the sense amplifier is responsive to the inverted clock signal;
storing a value of the data signal in the slave latch when the clock signal transitions from the low logic level to the high logic level; and
providing an output signal from the slave latch.

6. The method of claim 5, further comprising generating the inverted clock signal which transitions from the high logic level to the low logic level when the clock signal transitions from the low logic level to the high logic level.

7. The method of claim 5, wherein the transition of the clock signal from the high logic level to the low logic level and the transition of the inverted clock signal from the low logic level to the high logic level establishes at least two controlling nodes at a pre-charged state and at a discharged state respectively.

8. The method of claim 7, further comprising:
when a transition of the clock signal from the low logic level to the high logic level and the transition of the inverted clock signal from the high logic level to the low logic level occurs:
flipping a first node of the at least two controlling nodes based on the value of the data signal; and
not flipping a second node of the at least two controlling nodes to generate a pair of final output signals for the slave latch.

9. The method of claim 8, wherein the sense amplifier includes a first transistor and a second transistor, and the flipping the first node comprises a low logic level of the value of the data signal causing the first transistor to turn on.

10. The method of claim 9, wherein the not flipping the second node comprises the low logic level of the value of the data signal causing the second transistor to turn off.

11. The method of claim 8, further comprising:
pulling up or pulling down an internal node of the slave latch to produce a first signal based on the value of the data signal, wherein the pulling up or pulling down is based on the pair of final output signals while the clock signal is at the high logic level,
wherein the slave latch includes a transistor stack including a first transistor, a second transistor, a third transistor, and a fourth transistor, and drains of the second transistor and the third transistor form the internal node.

12. The method of claim 11, further comprising:
feeding back the first signal to a gate of the first transistor and a gate of the fourth transistor.

13. The method of claim 11, further comprising:
inverting the first signal to produce the output signal.

14. A clocked data circuit comprising:
a first data stage;
a second data stage;
a first latch buffer including a first buffer input, wherein an output of the first latch buffer is coupled to a first controlling node;
a second latch buffer including a second buffer input, wherein an output of the second latch buffer is coupled to a second controlling node;
a first clock stage coupled to an input of the first latch buffer;
a second clock stage coupled to an input of the second latch buffer;
a sense amplifier; and
a slave latch,
wherein the first data stage is coupled to a first input of the sense amplifier, the first input of the sense amplifier being the first controlling node,
wherein the second data stage is coupled to a second input of the sense amplifier, the second input of the sense amplifier being the second controlling node, and
wherein each of the first controlling node and the second controlling node is configured to be pre-charged by the first clock stage and the second clock stage, respectively, when a clock signal is a low level.

15. The clocked data circuit of claim 14, wherein, when the clock signal changes to a high level and an input data value is a low level, the first clock stage turns off, causing the first buffer input to go to a high level and driving an input of the second sense amplifier to a low level.

16. The clocked data circuit of claim 15, wherein, based on levels of the first controlling node and the second controlling node after the clock signal changes from the low level to the high level, the slave latch is configured to store a low level during the high level of the clock signal.

* * * * *